(12) United States Patent
Choi et al.

(10) Patent No.: US 8,337,949 B2
(45) Date of Patent: Dec. 25, 2012

(54) GRAPHENE PATTERN AND PROCESS OF PREPARING THE SAME

(75) Inventors: Jae-Young Choi, Suwon-si (KR); Hyeon-Jin Shin, Suwon-si (KR); Seon-mi Yoon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 1155 days.

(21) Appl. No.: 12/122,293

(22) Filed: May 16, 2008

(65) Prior Publication Data

US 2009/0324897 A1 Dec. 31, 2009

(30) Foreign Application Priority Data

Sep. 18, 2007 (KR) ........................ 10-2007-0094895
Mar. 13, 2008 (KR) ........................ 10-2008-0023458

(51) Int. Cl.
*B05D 3/02* (2006.01)

(52) U.S. Cl. ...................................... 427/227

(58) Field of Classification Search .................... 427/227
See application file for complete search history.

(56) References Cited

U.S. PATENT DOCUMENTS

| | | | |
|---|---|---|---|
| 6,800,584 B2 * | 10/2004 | Baker et al. .................. | 502/184 |
| 7,071,258 B1 | 7/2006 | Jang et al. | |
| 2002/0054849 A1 * | 5/2002 | Baker et al. ................. | 423/447.2 |
| 2002/0125805 A1 * | 9/2002 | Hsu ................................ | 313/309 |
| 2002/0127170 A1 * | 9/2002 | Hong et al. ................. | 423/447.3 |
| 2003/0108479 A1 * | 6/2003 | Baker et al. ................. | 423/447.3 |
| 2004/0060477 A1 * | 4/2004 | Iwaki et al. .................... | 106/472 |
| 2005/0025695 A1 * | 2/2005 | Pradhan ...................... | 423/447.3 |
| 2006/0008408 A1 * | 1/2006 | Ho Yoon et al. ............ | 423/447.2 |
| 2006/0018820 A1 * | 1/2006 | Little ......................... | 423/445 B |
| 2006/0115409 A1 * | 6/2006 | Li et al. ...................... | 423/447.1 |

FOREIGN PATENT DOCUMENTS

| | | |
|---|---|---|
| JP | 2003-081699 A | 3/2003 |
| KR | 1020030071352 A | 9/2003 |
| KR | 1020040025569 A | 3/2004 |
| KR | 1020070051839 A | 5/2007 |

* cited by examiner

*Primary Examiner* — Michael Cleveland
*Assistant Examiner* — Robert Vetere
(74) *Attorney, Agent, or Firm* — Cantor Colburn LLP (57) ABSTRACT

Provided are a graphene pattern and a process of preparing the same. Graphene is patterned in a predetermined shape on a substrate to form the graphene pattern. The graphene pattern can be formed by forming a graphitizing catalyst pattern on a substrate, contacting a carbonaceous material with the graphitizing catalyst and heat-treating the resultant.

17 Claims, 9 Drawing Sheets

GRAPHENE PATTERN AND PROCESS OF PREPARING THE SAME

CROSS-REFERENCE TO RELATED PATENT APPLICATION

This application claims the benefit of Korean Patent Application No. 10-2007-0094895, filed on Sep. 18, 2007 and 10-2008-0023458, filed on Mar. 13, 2008, in the Korean Intellectual Property Office, the disclosure of which is incorporated herein in its entirety by reference.

BACKGROUND OF THE INVENTION

1. Field of the Invention

The present invention relates to a graphene pattern and a process of preparing the same, and more particularly, to a graphene pattern formed in a predetermined shape on a substrate and a process of easily preparing the graphene pattern.

2. Description of the Related Art

Generally, graphite is a stack of two-dimensional graphene sheets formed from a planar array of carbon atoms bonded into hexagonal structures. Recently, as a result of testing properties of single-layered or several-layered graphene sheets, their beneficial properties have been revealed.

The most noticeable beneficial property is that electrons flow in a graphene sheet as if they are weightless, which means that electrons flow at the velocity of light in a vacuum. In addition, an unusual half-integer quantum hall effect for both electrons and holes is observed in the graphene sheet.

An electron mobility of known graphene sheets is about from 20,000 to 50,000 $cm^2/Vs$. Also, it is advantageous to use graphene sheets since products made from graphite are inexpensive while products made from carbon nanotubes which are similar to graphene sheets are expensive due to low yields obtained during synthesis and purification processes even though the carbon nanotubes are inexpensive themselves. Single wall carbon nanotubes exhibit different metallic and semiconducting characteristics according to their chirality and diameter. Furthermore, single wall carbon nanotubes having identical semiconducting characteristics have different energy band gaps depending on their chirality and diameter. Thus, single wall carbon nanotubes are required to be separated from each other in order to obtain desired semiconducting or metallic characteristics. However, separating single wall carbon nanotubes is not a simple process.

On the other hand, it is advantageous to use graphene sheets since a device can be easily designed to exhibit desired electrical characteristics by arranging the crystalline orientation in a desired direction since electrical characteristics of a graphene sheet are changed according to the crystalline orientation. The characteristics of the graphene sheet can be efficiently applied to carbonaceous electrical devices or carbonaceous electromagnetic devices in the future.

However, although the graphene sheet has these advantageous characteristics, a method of economically and reproducibly preparing a large-area graphene sheet has not been developed yet. The methods of preparing a graphene sheet are classified into a micromechanical method and a SiC thermal decomposition. According to the micromechanical method, a graphene sheet separated from graphite can be prepared on the surface of a Scotch™ tape by attaching the tape to a graphite sample and detaching the tape. In this case, the separated graphene sheet does not include a uniform number of layers, and does not have a uniform shape of tipped portions. Furthermore, a large-area graphene sheet cannot be prepared. Also, according to the SiC thermal decomposition, a SiC single crystal is heated to remove Si by decomposition of the SiC on the surface thereof, and then residual carbon C forms a graphene sheet. However, the SiC single crystal which is used as a starting material used in the SiC thermal decomposition is very expensive, and a large-area graphene sheet cannot be easily prepared.

Therefore, it is not easy to prepare a graphene sheet, and the graphene sheet cannot be easily patterned on a substrate.

SUMMARY OF THE INVENTION

The present invention provides a graphene pattern formed in a predetermined shape on a substrate.

The present invention also provides a process of preparing the graphene pattern.

According to an aspect of the present invention, there is provided a graphene pattern formed of 1-300 layered graphene which is a polycyclic aromatic molecule in which a plurality of carbon atoms are covalently bound to each other and formed on at least one surface of a substrate.

Graphene constituting the graphene pattern may have a single crystalline structure, and a peak ratio of D band/G band may be equal to or less than 0.2, and preferably 0 (zero) when a Raman spectrum of the graphene is measured.

According to another aspect of the present invention, there is provided a process of preparing a graphene pattern, the process including:

preparing a substrate on at least one surface of which a graphitizing catalyst pattern is formed;

contacting a carbonaceous material with the substrate on which the graphitizing catalyst pattern is formed; and forming graphene on the graphitizing catalyst pattern through heat-treatment in an inert or reductive atmosphere.

In the process, the carbonaceous material may be a carbon-containing polymer, a gaseous carbonaceous material, or a liquid carbonaceous material.

According to another aspect of the present invention, there is provided a process of preparing a graphene pattern, the process including:

preparing a substrate on at least one surface of which a graphitizing catalyst is formed;

contacting a carbonaceous material with the substrate; and forming a graphene pattern by selectively heat-treating the carbonaceous material in a predetermined pattern shape in an inert or reductive atmosphere.

In the process, the carbonaceous material may be a carbon-containing polymer, a gaseous carbonaceous material or a liquid carbonaceous material.

In the process, the graphitizing catalyst has a single crystalline structure.

In the process, the contacting the carbonaceous material with the substrate may be performed by: (a) coating a carbon-containing polymer as a carbonaceous material on the substrate on which the pattern is formed; (b) introducing a gaseous carbonaceous material as a carbonaceous material onto the substrate on which the pattern is formed; or (c) immersing the substrate on which the pattern is formed in a liquid carbonaceous material as a carbonaceous material and pre-heat-treating the resultant.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will now be described more fully with reference to the accompanying drawings, in which exemplary embodiments of the invention are shown.

Graphene having excellent electrical properties is formed on a substrate in a shape of a pattern to prepare a graphene pattern according to the present invention.

The "graphene" used herein indicates a polycyclic aromatic molecule in which a plurality of carbon atoms are covalently bound to each other. The covalently bound carbon atoms usually form 6-membered rings as a repeating unit, but can form 5-membered rings and/or 7-membered rings. Accordingly, in the graphene it appears as if the covalently bound carbon atoms (usually, $sp^2$ bond) form a single layer. The graphene may have not only a single layer, but also a plurality of layers up to a thickness of 100 nm. Generally, the side ends of the graphene are saturated with hydrogen atoms.

The graphene may be formed on a substrate, for example on a silica substrate, and a graphene pattern is formed in a desired shape at a predetermined portion. Thus, a graphene pattern can be efficiently applied to a carbonaceous electronic device, or the like by designing a circuit using graphene having excellent electric characteristics.

The graphene patter formed on the substrate may have 1-300 layers. When the number of the layers of the graphene pattern is greater than 300, electrical characteristics of the graphene may be deteriorated.

A graphitizing catalyst layer having a pattern similar to the graphene pattern may be interposed between the substrate and the graphene pattern. Since the graphitizing catalyst layer is formed during the formation of the graphene pattern, the graphene pattern may directly be in contact with the substrate when the graphitizing catalyst layer is removed by an acid-treatment, or the like, if desired, or the substrate, the graphitizing catalyst and the graphene pattern are sequentially stacked when the acid-treatment is not applied.

Examples of the substrate on which the graphene pattern is formed are: an inorganic substrate such as a Si substrate, a glass substrate and a GaN substrate; a plastic substrate such as PET, PES and PEN; and a metal substrate such as Ni, Cu and W, but are not limited thereto.

The graphitizing metal catalyst constituting the graphitizing catalyst layer may have a polycrystalline or single crystalline structure. The polycrystalline graphitizing metal catalyst can easily form a catalyst layer and is inexpensive. In addition, when the single crystalline structure is used as the graphitizing metal catalyst, a uniform graphene pattern can be formed since grains which are formed in a polycrystalline structure are not formed, and thus the graphene formation speed is the same throughout the entire surface.

The uniformity of the graphene can be identified by a Raman spectrum, particularly, by the presence of D band. D band intensity of a Raman spectrum indicates the presence of defects formed in the graphene. A strong D band peak may indicate a lot of defects in the graphene, and a weak D band peak or no D band peak may indicate few defects.

A peak ratio of D band/G band of the graphene sheet prepared by a stack formation method using a graphitizing metal catalyst may be equal to or less than 0.2, preferably equal to or less than 0.01, more preferably equal to or less than 0.001, and most preferably "0 (zero)" which indicates that there is few defects in the graphene.

The graphitizing metal catalyst assists carbon atoms to be bound to each other to form a planar hexagonal structure. Any catalyst used to synthesize graphite, induce carbonization or prepare carbon nanotubes can be used as the graphitizing catalyst. Examples of the graphitizing catalyst are at least one metal of Ni, Co, Fe, Pt, Au, Al, Cr, Cu, Mg, Mn, Mo, Rh, Si, Ta, Ti, W, U, V and Zr or an alloy thereof.

The single crystalline graphitizing metal catalyst may be prepared by single-crystallize the metal or the alloy, or a commercially available single crystalline metal may be used. Typically, the commercially available single crystalline metal is formed in a rod shape which can be cut into thin films in the form of a sheet to be used.

The graphene pattern described above may be prepared by a process shown below.

Figure 1:
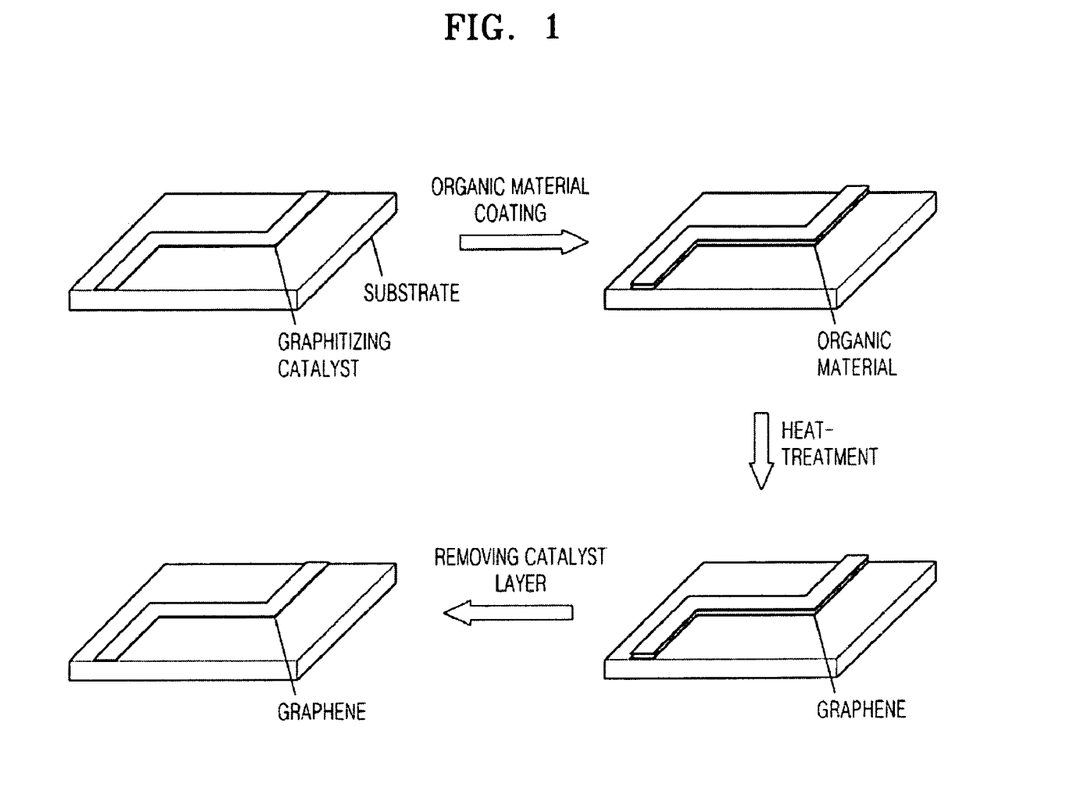
FIG. 1 schematically shows a process of preparing a graphene pattern according to an embodiment of the present invention.

FIG. 1 schematically shows a process of preparing a graphene pattern according to an embodiment of the present invention. A substrate on at least one surface of which a graphitizing catalyst pattern is formed is prepared, a carbonaceous material as a carbon source is contacted with the substrate on which the graphitizing catalyst pattern is formed, and graphene is formed on the graphitizing catalyst pattern by heat-treatment in an inert or reductive atmosphere to form a graphene pattern on the substrate.

In the process, any metal-patterning method that is commonly used in the art may be applied to prepare the graphitizing catalyst pattern on the substrate without limitation. For example, the graphitizing catalyst pattern may be formed on a substrate in a predetermined shape using a printing or in a high-precision pattern shape using a photolithography process.

In an example of a method of forming a graphitizing catalyst pattern according to the photolithography process, a high-precision pattern shape is formed by depositing a graphitizing catalyst on the entire surface of a substrate, forming a photoresist layer on the deposition, closely disposing a photomask to the photoresist layer and exposing and etching the resultant.

A carbonaceous material is contacted with the substrate after forming the graphitizing catalyst pattern. The contacting the carbonaceous material with the substrate may be performed by: (a) coating a carbon-containing polymer as a carbonaceous material on the substrate on which the pattern is formed; (b) introducing a gaseous carbonaceous material as a carbonaceous material onto the substrate on which the pattern is formed, or (c) immersing the substrate on which the pattern is formed in a liquid carbonaceous material as a carbonaceous material and pre-heat-treating the resultant.

The carbonaceous-material contacted with the graphitizing catalyst to form the graphene pattern may have any structure and any composition including carbon without limitation. The carbonaceous material that forms a dense coating can be used in order to form a dense graphite layer.

The carbonaceous material may be a carbon-containing polymer, a gaseous carbonaceous material, or a liquid carbonaceous material.

Figure 2:
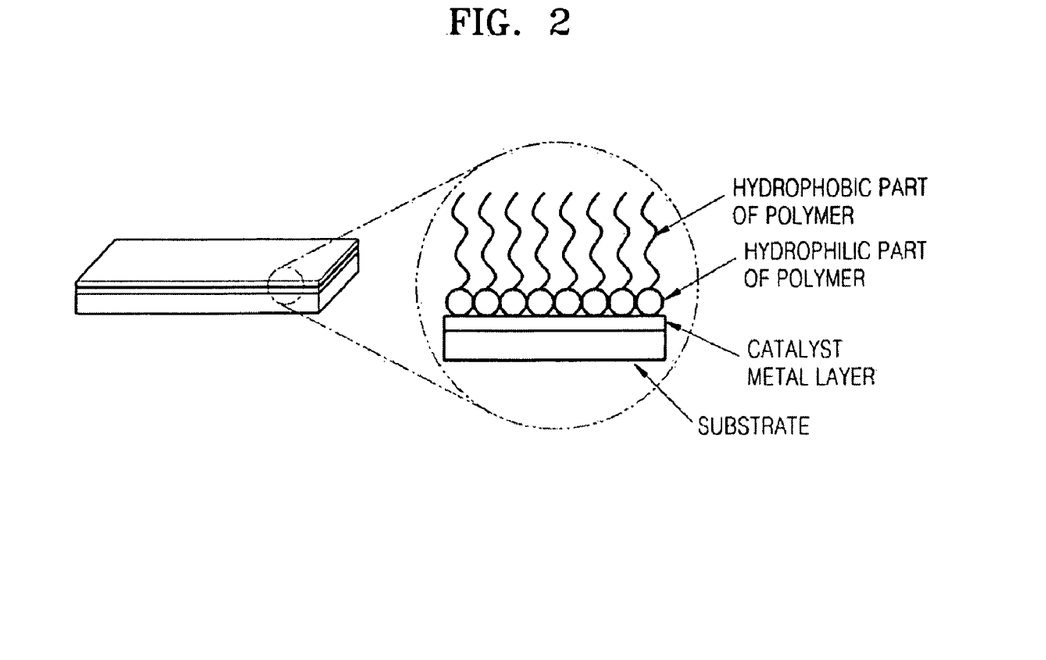
FIG. 2 schematically shows a polymer coated on a graphitizing catalyst.
Figure 3:
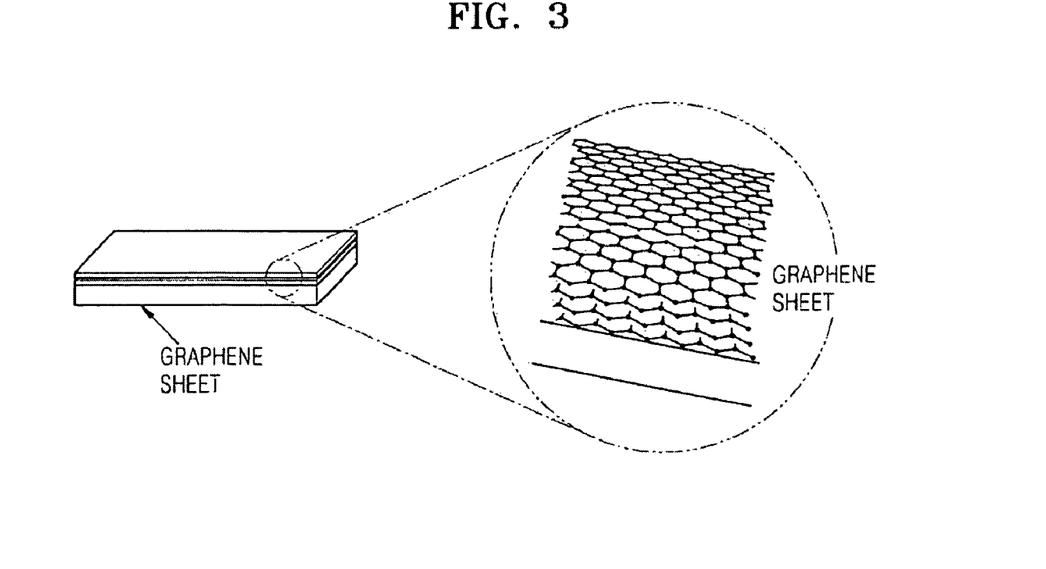
FIG. 3 schematically shows a structure of graphene formed on a graphitizing catalyst.

Any carbon-containing polymer may be used as the carbonaceous material without limitation. However, the self-assembling polymer is preferably used as the carbonaceous material since it is regularly arranged vertically extending from the surface of the graphitizing catalyst as shown in FIG. 2 and forms a graphene pattern having a high density as shown in FIG. 3.

The self-assembling polymer that forms a self-assembling layer may be at least one polymer selected from the group consisting of an amphiphilic polymer, a liquid crystal polymer and a conductive polymer.

The amphiphilic polymer includes a hydrophilic group and a hydrophobic group, and thus can be arranged in a constant direction in an aqueous solution. For example, Langmuir-Blodgett arrangements, dipping arrangements and spin arrangements are possible. The amphiphilic polymer includes a hydrophilic group having at least one of an amino group, a hydroxyl group, a carboxyl group, a sulfate group, a sulfonate group, a phosphate group and salts thereof; and a hydrophobic group having at least one of a halogen atom, a C1-C30 alkyl group, a C1-C30 halogenated alkyl group, a C2-C30 alkenyl group, a C2-C30 halogenated alkenyl group, a C2-C30 alkynyl group, a C2-C30 halogenated alkynyl group, a C1-C30 alkoxy group, a C1-C30 halogenated alkoxy group, a C1-C30 hetero alkyl group, a C1-C30 halogenated hetero alkyl group, a C6-C30 aryl group, a C6-C30 halogenated aryl group, a C7-C30 arylalkyl group and a C7-C30 halogenated arylalkyl group. Examples of the amphiphilic polymer are capric acid, lauric acid, palmitic acid, stearic acid, myristoleic acid, palmitolic acid, oleic acid, stearidonic acid, linolenic acid, capryl amine, lauryl amine stearyl amine and oleyl amine.

The liquid crystal polymer can be arranged in a direction in a liquid state. The conductive polymer is dissolved in a solvent to form a membrane and can form a crystalline structure by being aligned after the solvent is evaporated. Thus, the polymers can be aligned by dipping arrangements, spin coating arrangements, or the like. Examples of the polymer are polyacetylene, polypyrrole, polythiophene, polyanilline, polyfluorene, poly(3-hexylthiophene), polynaphthalene, poly(p-phenylene sulfide) and poly(p-phenylene vinylene).

Meanwhile, a polymer that is automatically aligned in a direction when deposited from vapor state, for example, a conductive polymer formed using deposition can also be used herein. Examples of the conductive polymer are acene and its derivatives, anthracene and its derivatives, hetero anthracene (e.g., benzodithiophene and dithienothiophene) and its derivatives, tetracene and its derivatives (e.g., halogenated tetracene, tetracene derivatives having a polar substituent, tetracene-thiophene hybrid materials, rubrene and alkyl-, and alkoxy-substituted tetracene), hetero tetracene and its derivatives, pentacene and its derivatives (e.g., alkyl- and halogen-substituted pentacene aryl-substituted pentacene, alkynyl-substituted pentacene, alkynyl-substituted alkyl and alkynyl pentacene and alkynyl-substituted pentacene ether), hetero pentacene and its derivatives and hetero acene and its derivatives.

The carbon-containing polymer may include, at least one polymerizable functional group capable of forming a carbon-carbon double bond or triple bond. The polymerizable functional group can induce polymerization of polymers through a process of polymerization such as UV irradiation after a layer is formed. Since thus formed carbonaceous material has a large molecular weight, evaporation of carbon can be prevented during the heat-treatment of the polymer.

The polymerization of the carbon-containing polymer may be performed before or after coating the polymer on the graphitizing catalyst. That is, when the polymerization is induced among the carbon-containing polymers before coating the polymer on the graphitizing catalyst, a carbonaceous material layer can be formed by transferring a polymer layer prepared by polymerization to the graphitizing catalyst. The polymerization and transfer can be repeated several times to control the thickness of the graphene sheet.

The carbon-containing polymer can be aligned on the surface of the graphitizing catalyst using various coating methods, such as Langmuir-Blodgett, dip coating, spin coating and vacuum deposition. In particular, the carbon-containing polymer may be coated on the entire surface of the substrate or selectively coated on the graphitizing catalyst using the coating methods.

Figure 4:
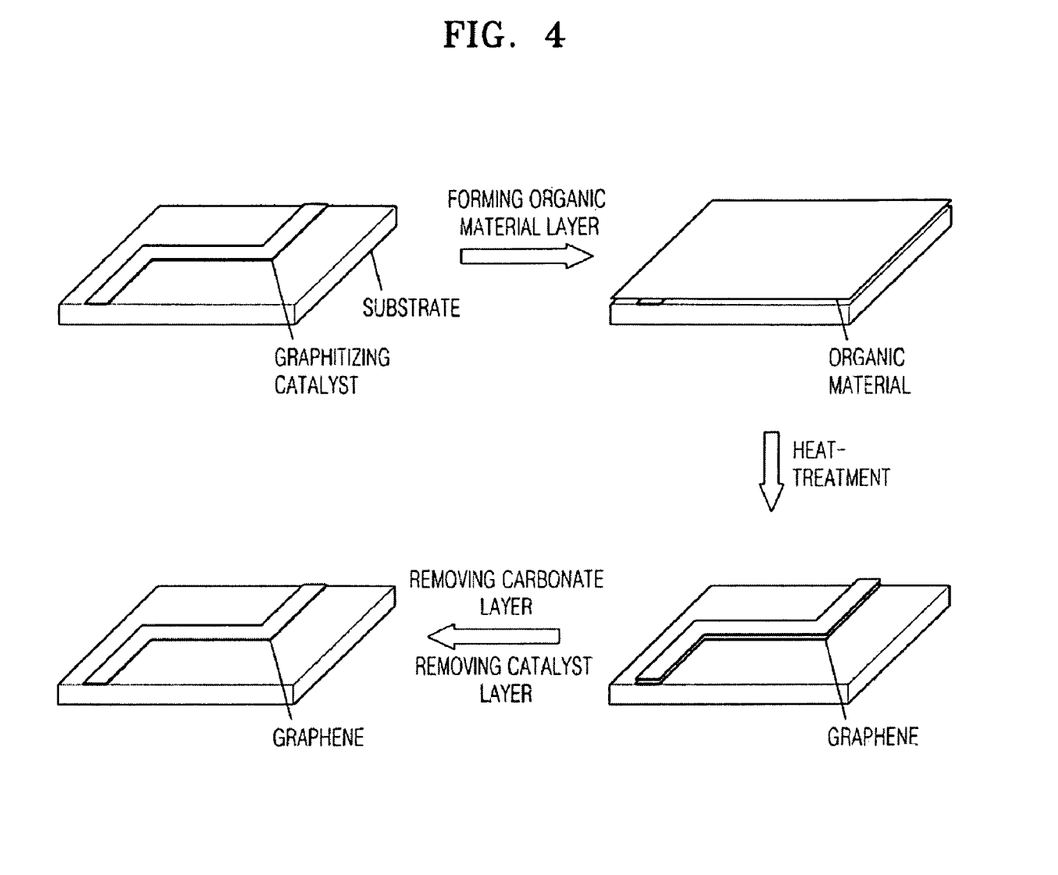
FIG. 4 schematically shows a process of preparing a graphene pattern according to an embodiment of the present invention.

When the carbon-containing polymer is selectively coated on the graphitizing catalyst, the polymer has an identical or a similar pattern to the patternized graphitizing catalyst. Even when the carbon-containing polymer is coated on the entire surface of the substrate as shown in FIG. 4, the carbon-containing polymer that is coated on a region on which the graphitizing catalyst is not coated is not affected by the graphitizing catalyst during the heat-treatment, and thus it is thermally decomposed to be evaporated or forms amorphous carbon. The amorphous carbon may be selectively removed during subsequent processes.

Meanwhile, the molecular weight of the carbon-containing polymer, thickness of the polymer layer or the number of self-assembling polymer layers may vary depending on a desired number of layers of the graphene. That is, use of a carbon-containing polymer having a large molecular weight increases the number of layers of the graphene since the polymer has a large amount of carbon. As the thickness of the polymer layer increases, the number of layers of the graphene is increased, and thus the thickness of the graphene is also increased. The thickness of the graphene can be controlled using the molecular weight and the amount of the carbon-containing polymer.

Figure 5:
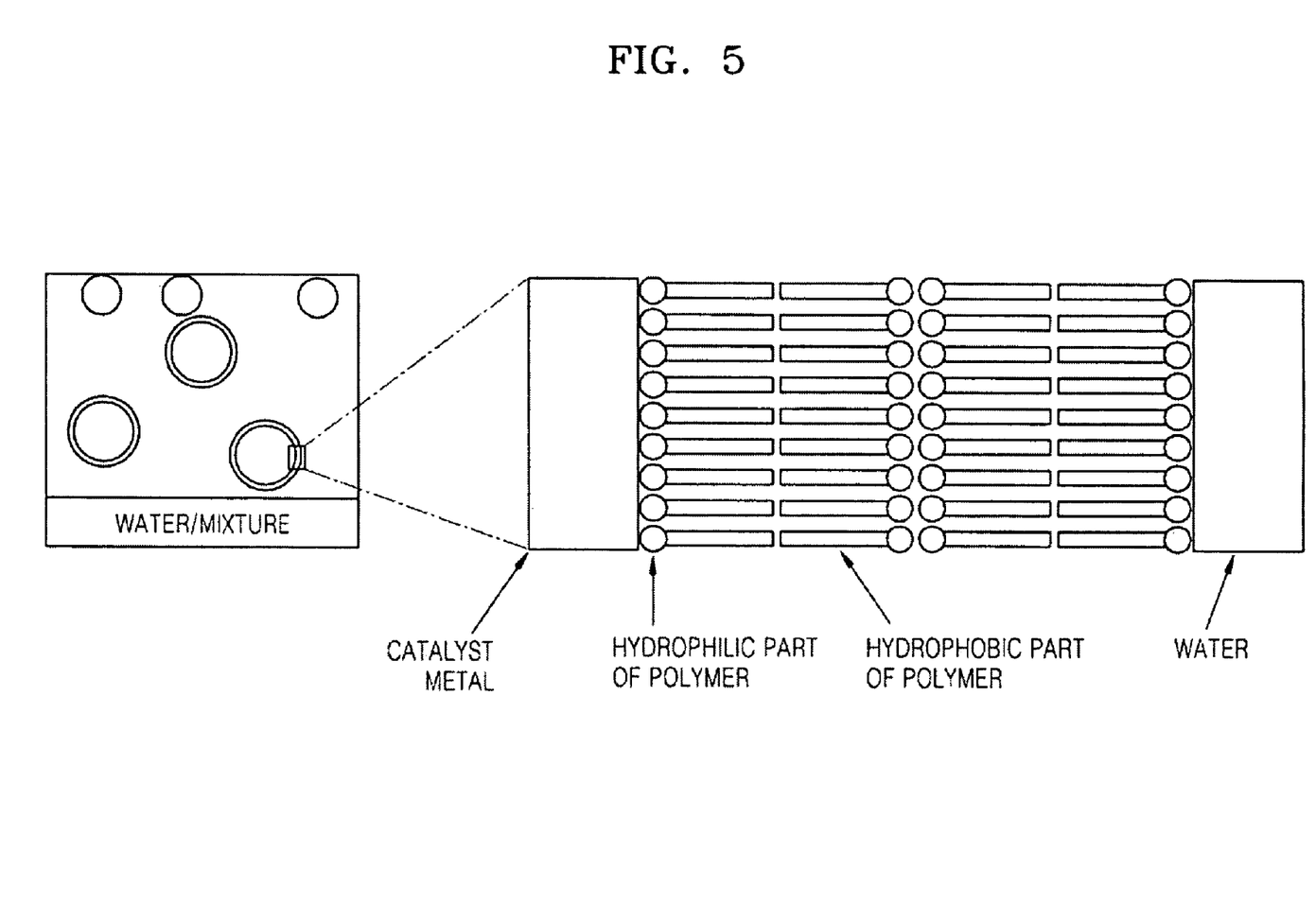
FIG. 5 schematically shows a stack of polymers formed on the graphitizing catalyst and having a hydrophilic part and a hydrophobic part.

In addition, the amphiphilic polymer which is a self-assembling polymer includes a hydrophilic part and a hydrophobic part in one molecule. As shown in FIG. 5, the hydrophilic part of the polymer is combined with the hydrophilic graphitizing catalyst to be uniformly aligned on the catalyst layer, and the hydrophobic part of the amphiphilic polymer is aligned in the opposite direction to be combined with the hydrophilic part of another amphiphilic polymer that is not combined with the catalyst layer. When the amount of the amphiphilic polymer is sufficient, the amphiphilic polymer can be stacked on the catalyst layer by the hydrophilic-hydrophobic bonds. The stacked layers formed of a plurality of the amphiphilic polymers can form a graphene layer by heat-treatment. Thus, a graphene pattern having a desired thickness can be prepared since the number of layers of the graphene can be controlled by selecting an appropriate amphiphilic polymer and adjusting the amount of the amphiphilic polymer.

Meanwhile, the gaseous carbonaceous material used as the carbonaceous material source is thermally decomposed by contacting with the graphitizing catalyst on the substrate to form graphene. Any material that can supply carbon and be in the gas phase at 300° C. or higher may be used as the gaseous carbonaceous material without limitation. The gaseous carbonaceous material may be a compound containing carbon, preferably 6 or less carbon atoms, more preferably 4 or less carbon atoms, and most preferably 2 or less carbon atoms. The compound containing carbon may include at least one selected from the group consisting of carbon monoxide, ethane, ethylene, ethanol, acetylene, propane, propylene, butane, butadiene, pentane, pentene, cyclopentadiene, hexane, cyclohexane, benzene and toluene.

The gaseous carbonaceous material may be introduced to a chamber including a graphitizing catalyst at a constant pressure. The chamber may only include the gaseous carbonaceous material, or further include an inert gas such as helium and argon.

In addition, hydrogen may be used with the gaseous carbon material in order to control gaseous reactions by cleaning the surface of a metal catalyst. The amount of the hydrogen may be in the range of 5 to 40% by volume, preferably 10 to 30% by volume, and more preferably 15 to 25% by volume based on the total volume of the chamber.

In addition, a liquid carbonaceous material used as the carbonaceous material is contacted with a substrate on which a graphitizing catalyst is formed, and the substrate is pre-heat-treated. Carbon thermally decomposed by the pre-heat-treatment is infiltrated into the graphitizing catalyst through a carborization process. The substrate may be immersed in the liquid carbonaceous material for the contact process.

The liquid carbonaceous material may be an organic solvent. Any organic solvent that can contain carbon and thermally decomposed by the graphitizing catalyst can be used without limitation. A polar or nonpolar organic solvent having a boiling point in the range of 60 to 400° C. may be used. The organic solvent may be an alcohol-based organic solvent, an ether-based organic solvent, a ketone-based organic solvent, an ester-based organic solvent, an organic acid solvent, or the like. Among these, the alcohol-based and ether-based organic solvents are preferably used since they have superior reactivity and reducing power and the graphitizing metal catalyst can be easily adsorbed to the solvents. Monohydric alcohols and polyhydric alcohols may be used alone or in combination as the alcohol-based organic solvent. Examples of the monohydric alcohol are propanol, pentanol, hexanol, heptanol and octanol. Examples of the polyhydric alcohol are propylene glycol, diethylene glycol, dipropylene glycol, triethylene glycol, tripropylene glycol, octylene glycol, tetraethylene glycol, neopentyl glycol, 1,2-butanediol, 1,3-butanediol, 2,3-butanediol, dimethyl-2,2-butanediol-1,2 and dimethyl-2,2-butanediol-1,3. The monohydric alcohols and polyhydric alcohols may have an ether group in addition to a hydroxyl group.

The liquid carbonaceous material may be used alone, or may further include a base. When a base is added to the liquid carbonaceous material, carburization speed may be increased. Thus, time required for the graphene formation may be reduced, and flocculation of particles may be prevented by increasing viscosity. The base may be added thereto alone, or with water to increase solubility. The base may be an organic and/or inorganic base, and examples of the base are tetramethyl ammonium chloride (TMAH), sodium hydroxide and potassium hydroxide. The concentration of the base may be in the range of 0.01 to 5.0 M in the organic solvent, but is not limited thereto. When the concentration of the base is less than 0.01 M, carburization speed is too slow, and flocculation of particles may not be controlled. On the other hand, when the concentration of the base is greater than 5.0 M, the viscosity is too high so that particles may not be separated from the solvent and may not be washed.

When the liquid carbonaceous material is used, carburization may be performed through the pre-heat-treatment. The liquid carbonaceous material is thermally decomposed by the graphitizing catalyst during the pre-heat-treatment. The thermal decomposition of the liquid carbonaceous material by the graphitizing catalyst is disclosed in Nature, vol 418, page 964. For example, the resultant products of the thermal decomposition of the organic solvent such as the polyhydric alcohol are alkanes, $H_2$, $CO_2$, $H_2O$, etc. Carbon elements among the resultant products are carburized into the catalyst. The disclosure is incorporated herein by reference.

The pre-heat-treatment for the thermal decomposition may be performed while stirring to sufficiently mix the liquid carbonaceous material and the catalyst at 100 to 400° C. for 10 minutes to 24 hours. When the pre-heat-treatment is performed at less than 100° C., the organic solvent may not be sufficiently thermally decomposed. On the other hand, when the pre-heat-treatment is performed at greater than 100° C., particles may be melted and flocculated. When the pre-heat-treatment is performed for less than 10 minutes, the organic solvent may not be sufficiently thermally decomposed. On the other hand, when the pre-heat-treatment is performed for more than 24 hours, the pre-heat-treatment is not economical.

Meanwhile, the carbon content in the catalyst may be controlled by controlling the degree of carburization, and thus the thickness of the graphene layer formed in a subsequent process can be controlled. For example, when a liquid carbonaceous material which is easily thermally decomposed is used, the amount of decomposed carbon is increased, so that a large amount of carbon can be carburized into the catalyst. In addition, carbon content carburized into the catalyst can be controlled by regulating the carburization process by controlling the temperature and time of the heat-treatment. As a result, the degree of graphene formation can also be controlled, so that the thickness of the graphene layer can be controlled.

Graphene constituting the graphene pattern may be a stack of a plurality of layers, preferably 1-300 layers, and more preferably 1-60 layers. The graphene having 300 layers or greater is regarded not as graphene but as graphite, which is not within the scope of the present invention.

Carbonaceous materials such as a carbon-containing polymer, a liquid carbonaceous material and a gaseous carbonaceous material are contacted with the graphitizing catalyst and the resultant is heat-treated to graphitize the carbonaceous material. The heat-treatment can be performed in an inert or reductive atmosphere in order to prevent oxidation of the elements of the carbonaceous material. Carbon atoms in the organic material are covalently bound to each other through the heat-treatment and form, for example, a planar hexagonal structure to form graphene on the substrate.

The heat-treatment is performed at a temperature in the range of 400 to 2,000° C. When the temperature is lower than 400° C., the graphitization cannot be sufficiently performed. On the other hand, when the temperature is higher than 2,000° C., carbon may be evaporated. The heat-treatment may be performed for 0.1 to 10 hours. When the heat-treatment time is not within the range described above, the graphitization cannot be sufficiently performed or economical efficiency may be decreased.

The heat-treatment may be performed by induction heatings, radiant heats, lasers, infrared rays (IR), microwaves, plasma, ultraviolet (UV) rays or surface plasmon heatings without limitation.

After the heat-treatment, the heat-treated resultant is subject to a cooling process. The cooling process is required to uniformly grow and regularly arrange the formed graphene. Since rapid cooling may cause cracks in the graphene sheet, the heat-treated graphene may be gradually cooled. For example, the heat-treated graphene may be cooled at a rate of 0.1-10° C./min or naturally cold. In a natural cooling process, a heat source is removed. In this regard, a sufficient cooling rate can be obtained only by removing the heat source.

According to the process of preparing a graphene pattern described above, a pattern of a graphitizing catalyst is formed, and then a graphene pattern is formed. Alternatively, a carbonaceous material may be directly patterned. That is, a graphitizing catalyst is deposited on the entire surface of a substrate using deposition, or the like, and then a carbonaceous material may be printed in a predetermined pattern without patterning the graphitizing catalyst or patterned by heat-treatment.

According to the printing of the carbonaceous material, a carbonaceous material is printed in a high-precision pattern on a substrate on which a graphitizing catalyst is entirely coated using an inkjet printing, or the like, and the resultant is heat-treated to form a graphene pattern.

Figure 6:
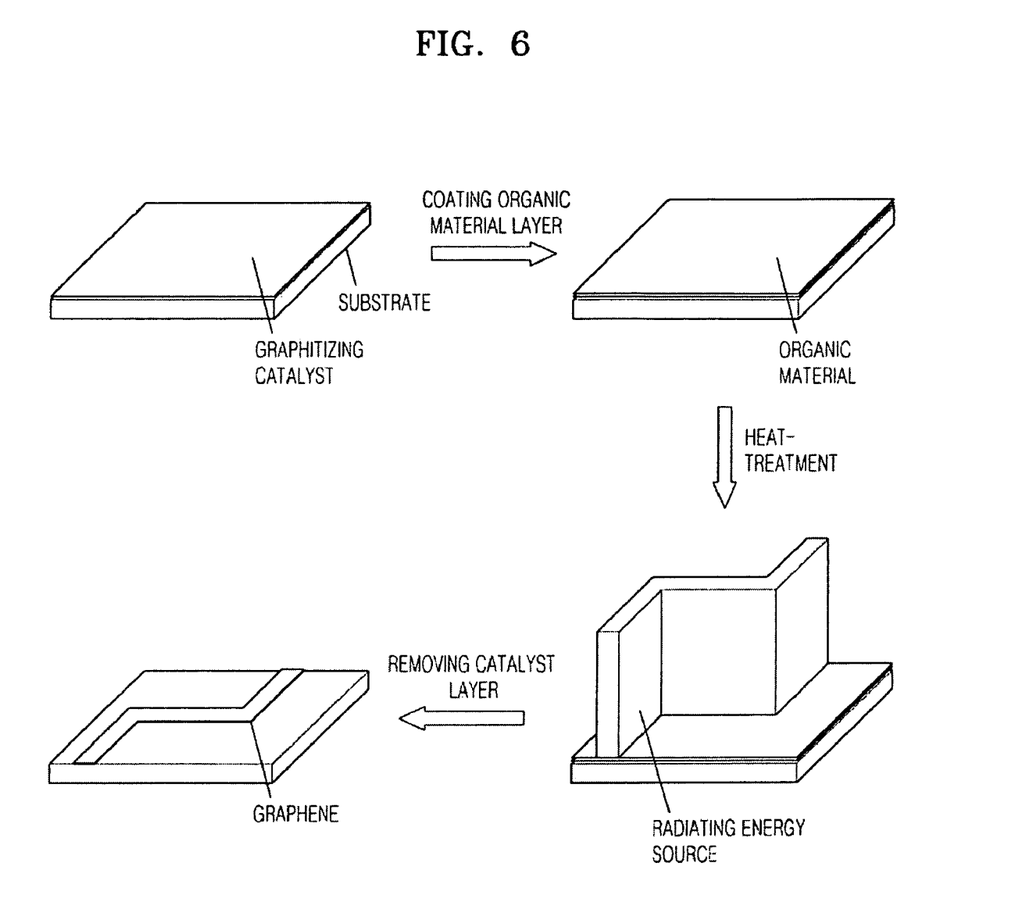
FIG. 6 schematically shows a process of preparing a graphene pattern according to an embodiment of the present invention.

According to the patterning of the carbonaceous material by heat-treatment, a carbonaceous material is contacted with a substrate on which a graphitizing catalyst is entirely coated and the carbonaceous material is selectively heated in a pattern shape to form a graphene pattern as shown in FIG. 6. Here, any energy source capable of patterning such as electrons, ions, ultraviolet rays, infrared rays, microwaves, and the like may be used without limitation. Since only a predetermined pattern is heated without heating the entire substrate, cracks of graphene which may occur during heat-treating the entire large-area substrate may be prevented, and a graphene pattern of plastic may also be formed on a substrate by controlling heating time and temperature.

Figure 7:
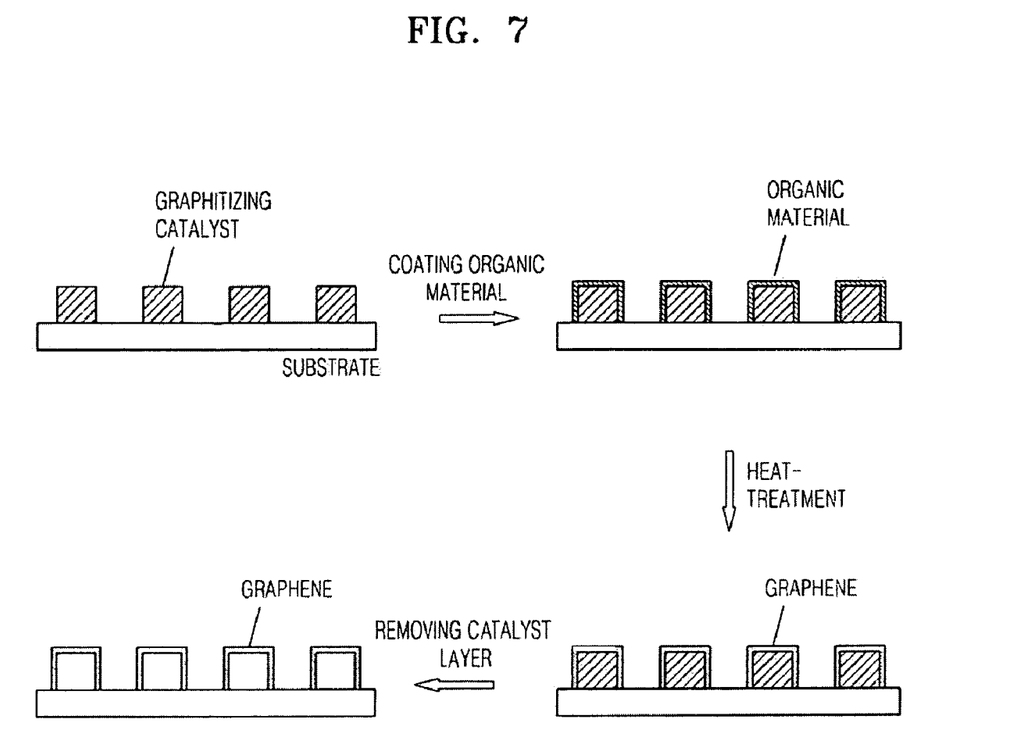
FIG. 7 schematically shows a process of preparing a graphene pattern according to an embodiment of the present invention.

The graphitizing catalyst used in various process of preparing the graphene pattern may be formed in a particulate shape. That is, the graphitizing catalyst particles are disposed in a desired shape on a substrate using dip coating, Langmuir-Blodgett, spin coating, or the like as shown in FIG. 7. Then, a graphene pattern has a shape of the graphitizing catalyst particles. Alternatively, a graphene pattern having a predetermined shape may be formed by coating an organic material on the surface of the graphitizing catalyst particles to form a core-shell structure and arranging and heat-treating the core-shell structure on the substrate. The particulate graphitizing catalyst may further include a core such as a metal oxide.

When a graphene pattern-formining process described above is performed, a graphitizing catalyst layer and a graphene pattern are sequentially formed on at least one surface of the substrate. Thus, graphitizing catalyst layer in itself may be used, or if desired, may be removed by an acid-treatment to directly bind the graphene pattern and the substrate.

According to a process of preparing a graphene pattern described above, a high-precision graphene pattern can be efficiently prepared in a simple process, and the thickness can be easily controls. Thus, the graphene pattern can be efficiently applied to various carbonaceous electronic devices.

The present invention will now be described in greater detail with reference to the following examples. The following examples are for illustrative purposes only and are not intended to limit the scope, of the invention.

EXAMPLE 1

A photoresist (PR) patterning was formed on a 3 cm×3 cm silicon substrate on which 100 nm of $SiO_2$ is coated, and Ni was deposited using sputtering to form a Ni high-precision pattern having a line width of 1 micron.

An oleic acid solution was separately prepared by dissolving oleic acid in chloroform to a concentration of 1 mg/ml. After water is added to a LB device, 50 μl of the oleic acid solution was dropped thereto. Then, a self assembled monolayer (SAM) was prepared using the LB device. The SAM formed of oleic acid was polymerized by radiating UV rays of a wavelength of 254 nm. The polymerized oleic acid SAM was transferred to the silicon substrate on which 100 nm of $SiO_2$ is coated.

Then, the oleic acid-coated substrate was dried by heating at 60° C. for 12 hours in a vacuum atmosphere. The dried oleic acid-coated substrate was heat-treated in a furnace at 500° C. for 1 hour in a nitrogen atmosphere to obtain a substrate including a single-layered graphene sheet in a predetermined pattern.

Then, the substrate on which the graphene pattern is formed was melted in 0.1 M HCl for 24 hours to remove the Ni thin film.

EXAMPLE 2

A substrate including a 4-layered graphene pattern was prepared in the same manner as in Example 1, except that the process of transferring the polymerized oleic acid SAM to the Ni pattern was repeated 4 times.

Then, the substrate on which the graphene pattern is formed was melted in 0.1 M HCl for 24 hours to remove the Ni thin film.

EXAMPLE 3

Ni was deposited on a 3 cm×3 cm silicon substrate on which 100 nm of $SiO_2$ is coated using sputtering to form a Ni thin film.

An oleic acid solution was separately prepared by dissolving oleic acid in chloroform to a concentration of 1 mg/ml. After water is added to a LB device, 50 μl of the oleic acid solution was dropped thereto. Then, a self assembled monolayer (SAM) was prepared using the LB device. The SAM formed of oleic acid was polymerized by radiating UV rays of a wavelength of 254 nm. The polymerized oleic acid SAM was transferred to the silicon substrate on which 100 nm of $SiO_2$ is coated. The process of transferring the polymerized oleic acid SAM to the substrate was repeated 4 times.

The substrate was partially heat-treated using e-beam to form a 4-layered graphene having a line width of 50 nm, and melted in 0.1 M HCl for 24 hours to remove the oleic acid SAM formed on the region on which graphene is not formed and the Ni thin film.

EXAMPLE 4

A 3 cm×3 cm three-dimensional silicon substrate on which 100 nm of $SiO_2$ is coated and a ZnO wire having a diameter of 80 nm and a length of several microns were prepared. The silicon substrate and the ZnO wire were introduced into an aqueous solution in which APS is dissolved, and the mixture was stirred, filtered and dried at room temperature for 1 hour to prepare a silicon substrate and ZnO wire coated with APS.

Figure 9:
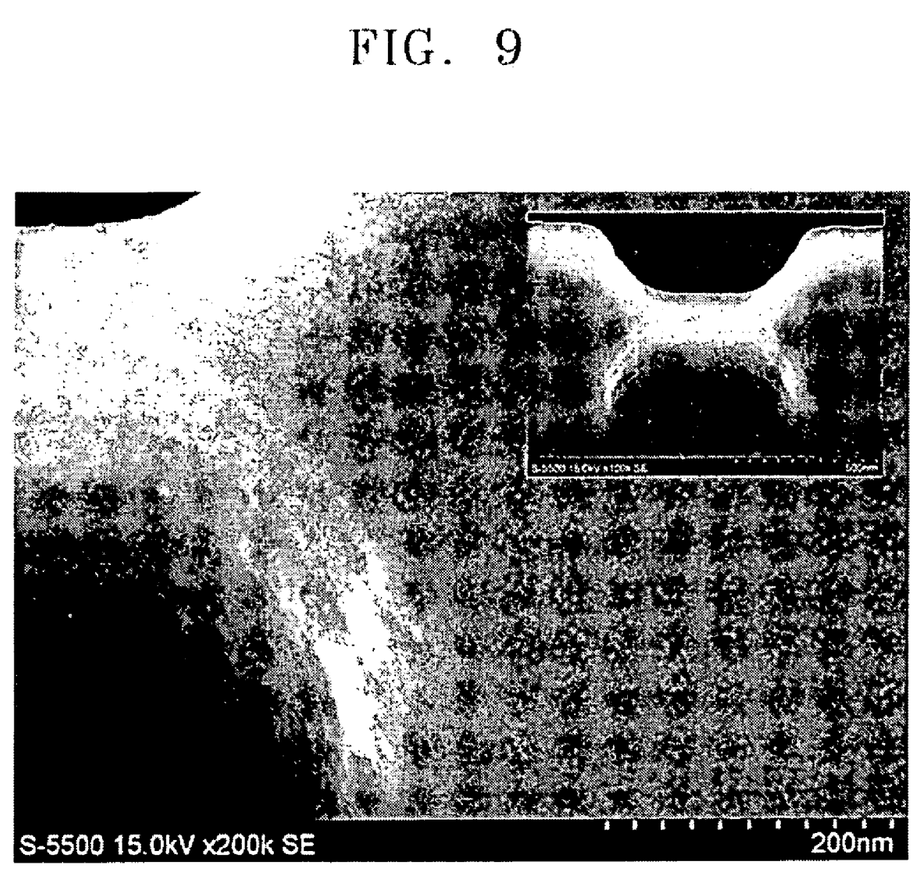
FIG. 9 is a SEM image of a silicon substrate structure on which Ni particles prepared according to Example 4 are coated.
Figure 10:
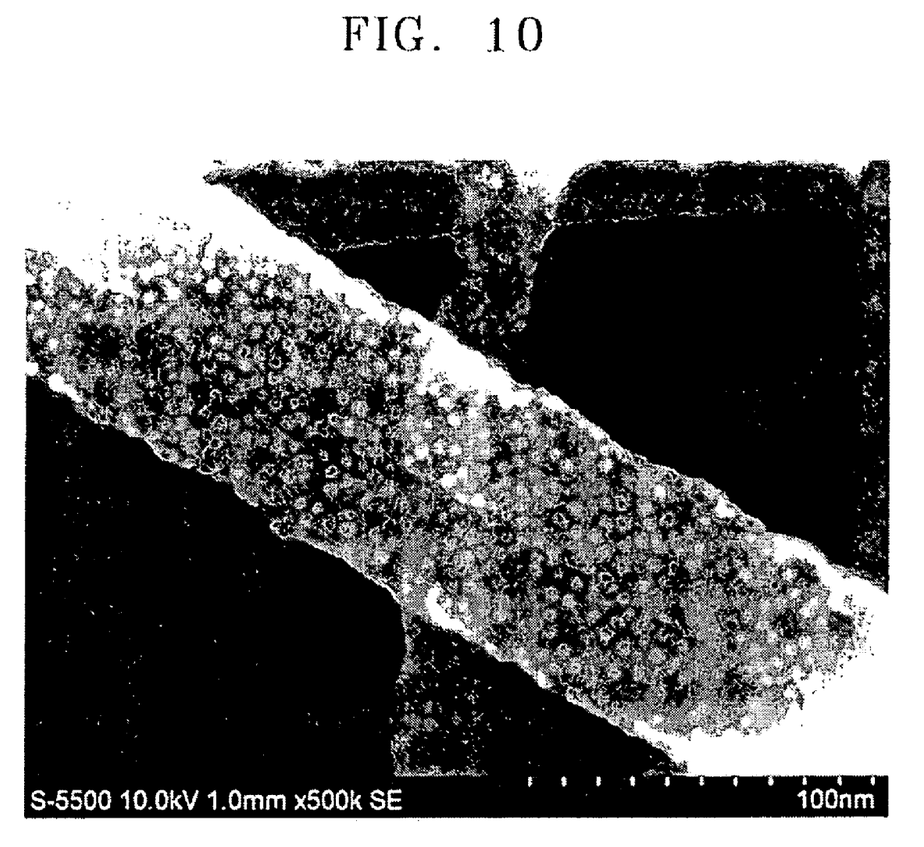
FIG. 10 is a SEM image of a ZnO wire structure on which Ni particles prepared according to Example 4 are coated.

An aqueous solution of 5 nm Ni particles coated with mercapto acetic acid was prepared. Each of the silicon substrate coated with APS and the ZnO wire coated with APS was introduced into the aqueous solution of Ni particles coated with mercapto acetic acid. Ni nanoparticles are arranged in a single layer on the silicon substrate by dipping the silicon substrate in an aqueous solution of Ni nanoparticles. Then, the resultants were added to an aqueous solution in which Ni particles are distributed, and the mixture was stirred, filtered and dried at room temperature for 1 hour to obtain a silicon substrate and a ZnO wire on which Ni particles are coated in a single layer. FIGS. 9 and 10 are SEM images of the silicon substrate and the ZnO wire.

Two solutions in which 46.7 g of distilled water and 1.4 g of oleic acid were prepared. The silicon substrate coated with Ni particles and the ZnO wire coated with Ni particles were added to the solutions, and the mixtures were stirred at 400 rpm for 5 hours. When the stirring is completed, the silicon substrate coated with Ni particles coated with oleic acid and the ZnO wire coated with Ni particles were separated from each other by removing water by adding them to filter paper and applying vacuum. The obtained sample was heated in a vacuum atmosphere at 60° C. for 12 hours to remove residual water from the surface of the Ni, particles. Ni particles coated with 5 nm and 3 nm of graphite were obtained on the surface of each of the silicon substrate and the ZnO wire by heat-treating the dried oleic acid-coated Ni particles in nitrogen atmosphere at 500° C. When each of the samples was melted in 0.1 M HCl for 24 hours, a silicon substrate and a ZnO wire on which spherical graphene shell formed of graphene may be prepared.

Figure 8:
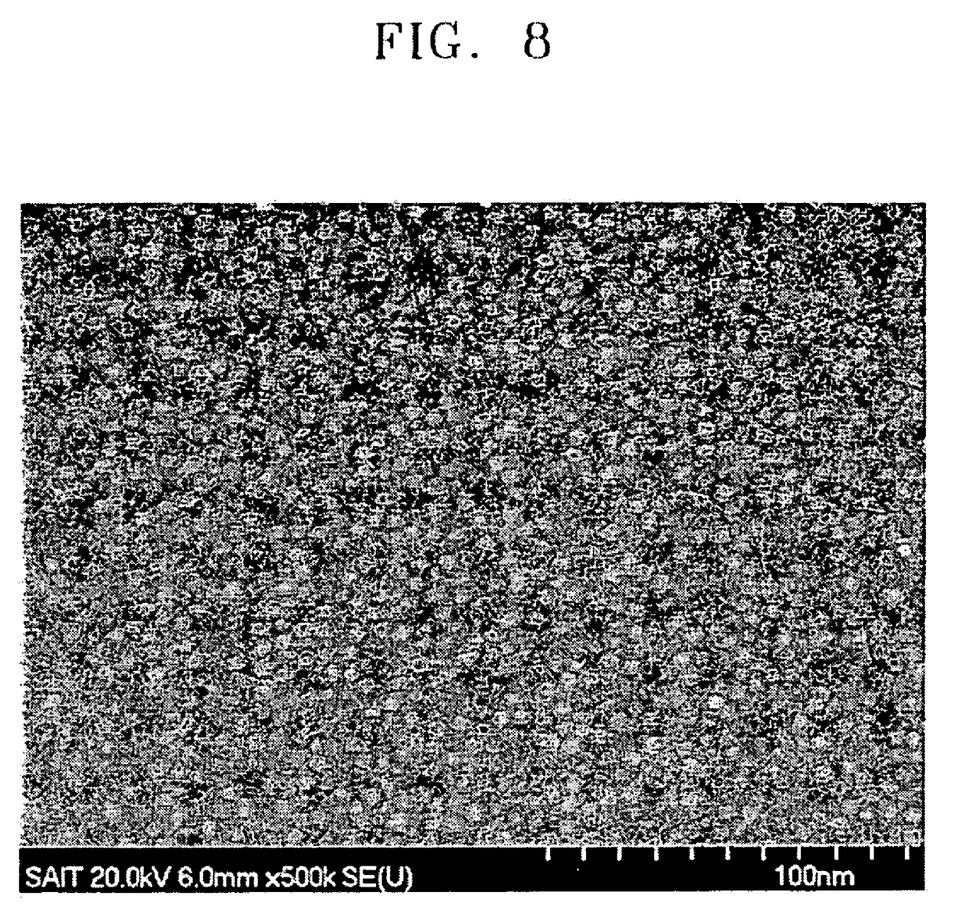
FIG. 8 is a scanning electron microscope (SEM) image of a graphene structure prepared according to Example 4.

FIG. 8 is a scanning electron microscope (SEM) image of a graphene structure prepared according to Example 4. FIG. 9 is a SEM image of a three-dimensional silicon substrate structure on which Ni particles prepared according to Example 4 are coated. FIG. 10 is a SEM image of a ZnO wire structure on which Ni particles prepared according to Example 4 are coated.

EXAMPLE 5

A photoresist (PR) patterning was formed on a 3 cm×3 cm silicon substrate on which 100 nm of $SiO_2$ is coated, and Ni was deposited using sputtering to form a Ni high-precision pattern having a line width of 1 micron.

The silicon substrate on which the $SiO_2$ and Ni high-precision pattern were formed was disposed in a chamber, and heat-treated at 400° C. for 20 minutes using a halogen lamp as a heat source while acetylene gas was added to the chamber at a constant rate of 200 sccm to form graphene on the graphitizing catalyst.

Then, a 7 layered graphene sheet was formed by removing the heat source and naturally cooling the interior of the chamber to grow graphene in a uniform arrangement.

Then, the substrate including the graphene sheet was immersed in 0.1 M HCl for 24 hours to remove the Ni metal pattern.

EXAMPLE 6

A single crystalline Ni in which an oxide is removed was placed in a silicon substrate and a photoresist (PR) patterning was formed on the single crystalline Ni, and Ni was removed to form a Ni high-precision pattern having a line width of 1 micron.

Then, the substrate was heat-treated at 750° C. for 2 minutes using a halogen lamp heat source while introducing acetylene gas and hydrogen gas into the chamber respectively at 5 sccm and 45 sccm to form graphene on a graphitizing catalyst pattern.

Then, the heat source was removed and the chamber was naturally cooled to grow the graphene to a constant thickness, thereby forming a graphene pattern having about 7 layers.

Then, the substrate on which the graphene sheet is formed was melted in 0.1 M HCl for 24 hours to remove the Ni thin film.

A Raman spectrum of the graphene pattern was measured. The formation of graphene was identified by G peak shown at 1594 $cm^{-1}$. In addition, D/G=0.193 was identified by D peak shown at 1360 $cm^{-1}$.

EXAMPLE 7

A photoresist (PR) patterning was formed on a 3 cm×3 cm silicon substrate on which 100 nm of $SiO_2$ is coated, and Ni was deposited using sputtering to form a Ni high-precision pattern having a line width of 1 micron.

500 ml of diethylene glycol was added to a reactor, 89.7 ml of 25% tetramethyl ammonium chloride (TMAH) aqueous solution was added thereto, and the substrate was immersed in the solution.

Then, the Ni metal pattern was carburized by reacting the substrate with the solution while mechanically mixing (despa) at 230° C. or more for 4 hours. The carburized substrate was separated and dried in a vacuum oven at 50° C. overnight. The dried carburized substrate was heat-treated in an argon atmosphere at 450° C. for 1 hour to form graphene on the surface of the Ni pattern.

Then, the substrate on which the graphene is formed was melted in 0.1 M HCl for 24 hours to remove the Ni metal pattern.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A process of preparing a graphene pattern, the process comprising:
   disposing a graphitizing catalyst on at least one surface of a substrate;
   removing a portion of the graphitizing catalyst to form a graphitizing catalyst pattern;
   contacting the graphitizing catalyst pattern with a carbonaceous material to form a self-assembled monolayer of the carbonaceous material; and
   forming graphene on the graphitizing catalyst pattern by heat-treating the graphitizing catalyst pattern and the carbonaceous material in an inert or reductive atmosphere to form the graphene pattern, wherein a shape of the graphene pattern corresponds to a shape of the graphitizing catalyst pattern.

2. The process of claim 1, wherein the carbonaceous material is a carbon-containing polymer, a gaseous carbonaceous material or a liquid carbonaceous material.

3. The process of claim 1, wherein the graphitizing catalyst has a single crystalline structure.

4. The process of claim 1, wherein the contacting the graphitizing catalyst pattern with the carbonaceous material comprises:
   (a) coating a carbon-containing polymer as a carbonaceous material on the substrate on which the pattern is formed;

(b) introducing a gaseous carbonaceous material as a carbonaceous material onto the substrate on which the pattern is formed; or (c) immersing the substrate on which the graphitizing catalyst pattern is formed in a liquid carbonaceous material as a carbonaceous material and pre-heat-treating the resultant.

5. The process of claim 1, wherein the graphitizing catalyst is at least one selected from the group consisting of Ni, Co, Fe, Pt, Au, Al, Cr, Cu, Mg, Mn, Mo, Rh, Si, Ta, Ti, W, U, V and Zr.

6. The process of claim 1, wherein the heat-treating is performed at a temperature in the range of 400 to 2,000° C. for 0.1 to 10 hours.

7. The process of claim 1, further comprising removing the graphitizing catalyst pattern by an acid-treatment after the heat-treatment.

8. The process of claim 1, herein the removing a portion of the graphitizing catalyst pattern comprises etching.

9. A process of preparing a graphene pattern, the process comprising:
   forming a graphitizing catalyst on at least one surface of a substrate;
   contacting the graphitizing catalyst with a carbonaceous material to form a coating comprising a self-assembled monolayer of the carbonaceous material on the graphitizing catalyst; and
   selectively heat-treating a portion of the coating of the carbonaceous material in an inert or reductive atmosphere to form the graphene pattern on the graphitizing catalyst, wherein a shape of the graphene pattern corresponds to a shape of the selectively heat-treating.

10. The process of claim 9, wherein the carbonaceous material is a carbon-containing polymer, a gaseous carbonaceous material or a liquid carbonaceous material.

11. The process of claim 9, wherein the graphitizing catalyst has a single crystalline structure.

12. The process of claim 9, wherein the contacting the graphitizing catalyst pattern with the carbonaceous material comprises:
   (a) coating a carbon-containing polymer as a carbonaceous material on the substrate on which the pattern is formed;
   (b) introducing a gaseous carbonaceous material as a carbonaceous material onto the substrate on which the pattern is formed; or
   (c) immersing the substrate on which the graphitizing catalyst is formed in a liquid carbonaceous material as a carbonaceous material and pre-heat-treating the resultant.

13. The process of claim 9, wherein the graphitizing catalyst is at least one selected from the group consisting of Ni, Co, Fe, Pt, Au, Al, Cr, Cu, Mg, Mn, Mo, Rh, Si, Ti, V, W U, V and Zr.

14. The process of claim 9, wherein the selectively heat-treating is performed at a temperature in the range of 400 to 2,000° C. for 0.1 to 10 hours.

15. The process of claim 9, further comprising removing the graphitizing catalyst by an acid-treatment after the heat-treatment.

16. A process of preparing a graphene pattern, the process comprising:
   printing a graphitizing catalyst on at least one surface of a substrate to form a graphitizing catalyst pattern;
   contacting the graphitizing catalyst pattern with a carbonaceous material to form a coating comprising a self-assembled monolayer of the carbonaceous material on the graphitizing catalyst pattern; and
   forming graphene on the graphitizing catalyst pattern by heat-treating the graphitizing catalyst pattern and the coating of the carbonaceous material in an inert or reductive atmosphere to form the graphene pattern, wherein a shape of the graphene pattern corresponds to a shape of the graphitizing catalyst pattern.

17. The process of claim 16, wherein a shape of the coating of the carbonaceous material corresponds to a shape of the graphitizing catalyst pattern.

\* \* \* \* \*